United States Patent
Song

(10) Patent No.: US 8,456,924 B2
(45) Date of Patent: Jun. 4, 2013

(54) SEMICONDUCTOR MEMORY DEVICE AND METHOD FOR OPERATING THE SAME

(75) Inventor: Choung-Ki Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 363 days.

(21) Appl. No.: 12/856,131

(22) Filed: Aug. 13, 2010

(65) Prior Publication Data

US 2011/0292739 A1 Dec. 1, 2011

(30) Foreign Application Priority Data

May 28, 2010 (KR) .................. 10-2010-0050441

(51) Int. Cl.
*G11C 7/10* (2006.01)
(52) U.S. Cl.
USPC .................. 365/189.05; 365/193; 365/233
(58) Field of Classification Search
USPC .......... 365/189.05, 193, 233, 189.16, 189.09, 365/189.07, 189.02, 236, 189.08, 230.06, 365/189.17, 194
See application file for complete search history.

(56) References Cited

U.S. PATENT DOCUMENTS

| 5,831,927 | A  | * | 11/1998 | Casper et al. ............ 365/230.06 |
| 6,862,248 | B2 | * | 3/2005  | Shin ........................ 365/233.13 |
| 7,016,256 | B2 | * | 3/2006  | Yoon et al. ................ 365/189.16 |
| 7,103,793 | B2 | * | 9/2006  | Rentschler et al. ........... 713/502 |
| 2002/0172079 | A1 | * | 11/2002 | Hargis et al. .................. 365/193 |
| 2003/0147299 | A1 |   | 8/2003  | Setogawa |
| 2005/0002220 | A1 |   | 1/2005  | Krause |
| 2007/0291558 | A1 | * | 12/2007 | Joo .............................. 365/194 |

FOREIGN PATENT DOCUMENTS

| KR | 1020070080455 | 8/2007 |
| KR | 100873627     | 12/2008 |

OTHER PUBLICATIONS

Notice of Allowance issued by the Korean Intellectual Property Office on Nov. 30, 2011.

* cited by examiner

*Primary Examiner* — Dang Nguyen
(74) *Attorney, Agent, or Firm* — IP & T Group LLP

(57) ABSTRACT

A semiconductor memory device includes a data alignment unit configured to align data, which are sequentially inputted, in response to a data strobe signal, a latching operation control unit configured to receive the data strobe signal, and generate a latching control signal after an interval between a write operation and a next write operation elapses, a data latching unit configured to latch output signals of the data alignment unit in response to the latching control signal, and a data synchronization output unit configured to synchronize output signals of the data latching unit in response to a data input strobe signal, and output the synchronized signals to a plurality of data lines.

27 Claims, 16 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2010-0050441, filed on May 28, 2010, which is incorporated herein by reference in its entirety.

BACKGROUND OF THE INVENTION

Exemplary embodiments of the present invention relate to semiconductor design technology, and more particularly, to a semiconductor memory device which receives data and a data strobe signal which are transferred from a chipset, and performs a write operation with the data.

In general, semiconductor memory devices, such as double data rate synchronous dynamic random access memory (DDR SDRAM), use a data strobe signal to accurately recognize input data. The data strobe signal is outputted with data from a chipset, such as a memory controller, and toggles with the data. Signals transferred to a semiconductor memory device from a chipset include an external clock signal. Since the external clock signal and data are transferred through transfer lines having different loads, the two signals may be transferred at different speeds. Accordingly, it is not easy to recognize the data by using the external clock signal. Therefore, the chipset transfers a data strobe signal to the semiconductor memory device through a transfer line having a similar load to that of the transfer line through which the data is transferred. The semiconductor memory device may accurately recognize the data by using the data strobe signal transferred in such a manner. The data strobe signal should guarantee a setup time and a hold time with respect to the data, and is generally composed of a data strobe signal and a data strobe bar signal.

FIG. 1 is a timing diagram illustrating the effects of a write operation on signals of a conventional semiconductor memory device.

Referring to FIG. 1, the semiconductor memory device receives an external clock signal CLK, a data strobe signal DQS, a data strobe bar signal DQSB, and data DAT from an external chipset. In an idle state, the data strobe signal DQS and the data strobe bar signal DQSB maintain a termination level which corresponds to a half of the voltage level of a power supply voltage. After a preamble period, the data strobe signal DQS and the data strobe bar signal DQSB start to toggle with the data DAT. For reference, during the preamble period, the data strobe signal DQS maintains a logic 'low' level and the data strobe bar signal DQSB maintains a logic 'high' level. During a toggling period, the data strobe signal DQS and the data strobe bar signal DQSB swing in a narrow range on the basis of the termination level. That is, the termination level is the center voltage level of a high voltage level and a low voltage level that the data strobe signal DQS and the data strobe bar signal DQSB swing or toggle between.

Meanwhile, the semiconductor memory device internally buffers the data strobe signal DQS and the data strobe bar signal DQSB which are inputted from the external chipset, and generates a rising data strobe signal DQSR corresponding to the data strobe signal DQS and a falling data strobe signal DQSF corresponding to the data strobe bar signal DQSB. The data DAT are latched and shifted according to the rising data strobe signal DQSR and the falling data strobe signal DQSF, and outputted as zeroth to third alignment signals ALGN0 to ALGN3.

As shown in FIG. 1, the data DAT corresponding to the rising data strobe signal DQSR (that is, data R0, R1, R2, and R3) are latched in response to the rising data strobe signal DQSR. Then, the latched data are shifted and the data DAT corresponding to the falling data strobe signal DQSF (that is, data F0, F1, F2, and F3) are latched, in response to the falling data strobe signal DQSF. In other words, the data DAT, which are sequentially inputted, are aligned as the zeroth to third alignment signals ALGN0 to ALGN3 in response to the rising data strobe signal DQSR and the falling data strobe signal DQSF.

Meanwhile, the semiconductor memory device performs a variety of operations corresponding to various operation modes. Such operation modes may depend on a burst length. The burst length corresponds to the number of data which are received at a time by one data pin. When the burst length is four, it means that four data are received. When the burst length is eight, it means that eight data are received. The semiconductor device internally generates a signal depending on such a burst length. The signal is referred to as a data input strobe signal.

Hereafter, a case in which the burst length is eight will be described with reference to FIG. 1.

The data DAT which are consecutively applied are latched and shifted in response to the rising data strobe signal DQSR and the falling data strobe signal DQSF. At this time, when a first data input strobe signal DISTBP_BL4 is activated, data R0, F0, R1, and F1 of the zeroth to third alignment signals ALGN0 to ALGN3 are latched as fourth to seventh alignment signals ALGN<4:7>. Subsequently, the data DAT are latched and shifted one more time, in response to the rising data strobe signal DQSR and the falling data strobe signal DQSF. At this time, when a second data input strobe signal DISTBP_BL8 is activated, the data R0, F0, R1, and F1 of the fourth to seventh alignment signals ALGN<4:7> and data R2, F2, R3, and F3 of the zeroth to third alignment signals ALGN0 to ALGN3 are outputted to corresponding global data lines GIO<0:7>.

For reference, when the burst length is four, the semiconductor memory device outputs the data R0, F0, R1, and F1, respectively transferred as the zeroth to third alignment signals ALGN0 to ALGN3, to the corresponding global data lines, in response to the second data input strobe signal DISTBP_BL8.

As described above, the data R0, F0, R1, and F1 of the zeroth to third alignment signals ALGN0 to ALGN3 are synchronized in response to the first data input strobe signal DISTBP_BL4, and the data R2, F2, R3, and F3 are synchronized in response to the second data input strobe signal DISTBP_BL8. Ideally, the period of time between the first data input strobe signal DISTBP_BL4 and the second data input strobe signal DISTBP_BL8 is one cycle (1 tCK) of the external clock signal CLK. Significantly, however, a skew with respect to the external clock signal CLK occurs in the data strobe signal DQS and the data strobe bar signal DQSB. Hereinafter, the specification refers to the margin of time that the data strobe signal DQS lags or leads the external clock signal CLK as 'tDQSS'. Further, hereinafter, tDQSS is defined as ±¼ of one cycle (1 tCK) of the external clock signal CLK. Therefore, the synchronization operation may be performed by the first data input strobe signal DISTBP_BL4 and the second data input strobe signal DISTBP_BL8 within a time margin of 0.5 tCK.

Such a time margin of 0.5 tCK may make it difficult to perform the synchronization operation according to the first data input strobe signal DISTBP_BL4 and the second data input strobe signal DISTBP_BL8. Furthermore, as the operation frequency of the semiconductor memory device increases, a pulse period corresponding to 1 tCK gradually decreases. Therefore, an actual time margin further decreases. As a result, when the synchronization operation according to the first data input strobe signal DISTBP_BL4 and the second data input strobe signal DISTBP_BL8 is not normally performed, an operation error of the semiconductor memory device may result.

SUMMARY OF THE INVENTION

Exemplary embodiments of the present invention are directed to a semiconductor memory device which is capable of securing a sufficient time margin between aligned data and a data input strobe signal.

Exemplary embodiments of the present invention are also directed to a semiconductor memory device which is capable of controlling an activation time of a latching control signal depending on an operation mode, and latching aligned data.

In accordance with an exemplary embodiment of the present invention, a semiconductor memory device includes a data alignment unit configured to align data, which are sequentially inputted, in response to a data strobe signal, a latching operation control unit configured to receive the data strobe signal, and generate a latching control signal in response to information indicating an interval between a write operation and a next write operation, a data latching unit configured to latch output signals of the data alignment unit in response to the latching control signal, and a data synchronization output unit configured to synchronize output signals of the data latching unit in response to a data input strobe signal, and output the synchronized signals to a plurality of data lines.

In accordance with another exemplary embodiment of the present invention, a semiconductor memory device includes a data alignment unit configured to align data, which are sequentially inputted, in response to a data strobe signal, a latching operation control unit configured to receive the data strobe signal during a write operation, and generate a latching control signal in response to operation mode information, a data latching unit configured to latch the output signals of the data alignment unit in response to the latching control signal, and a data synchronization output unit configured to synchronize output signals of the data latching unit in response to a data input strobe signal, and output the synchronized signals to a plurality of data lines.

In accordance with yet another embodiment of the present invention, a method for operating a semiconductor memory device includes aligning data, which are sequentially inputted, in response to a data strobe signal, receiving the data strobe signal during a write operation, and generating a latching control signal in response to operation mode information, latching the aligned data in response to the latching control signal, and outputting the latched data to a plurality of data lines in response to a data input strobe signal.

DESCRIPTION OF SPECIFIC EMBODIMENTS

Figure 1:
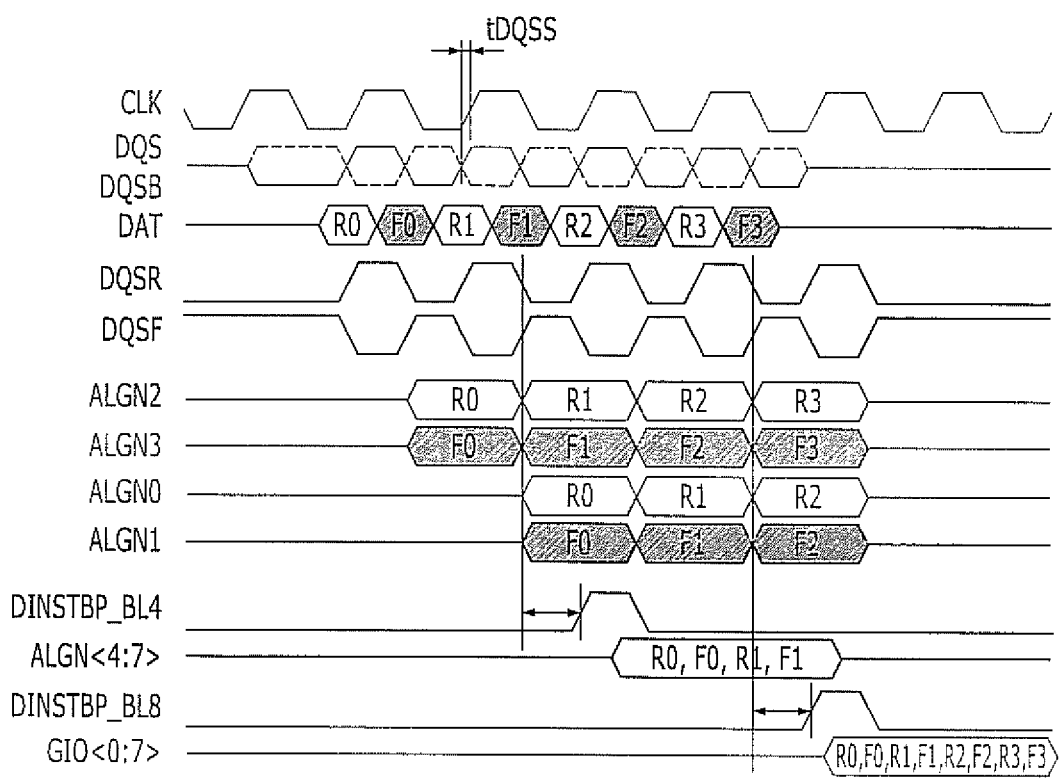
FIG. 1 is a timing diagram illustrating the effects of a write operation on signals of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
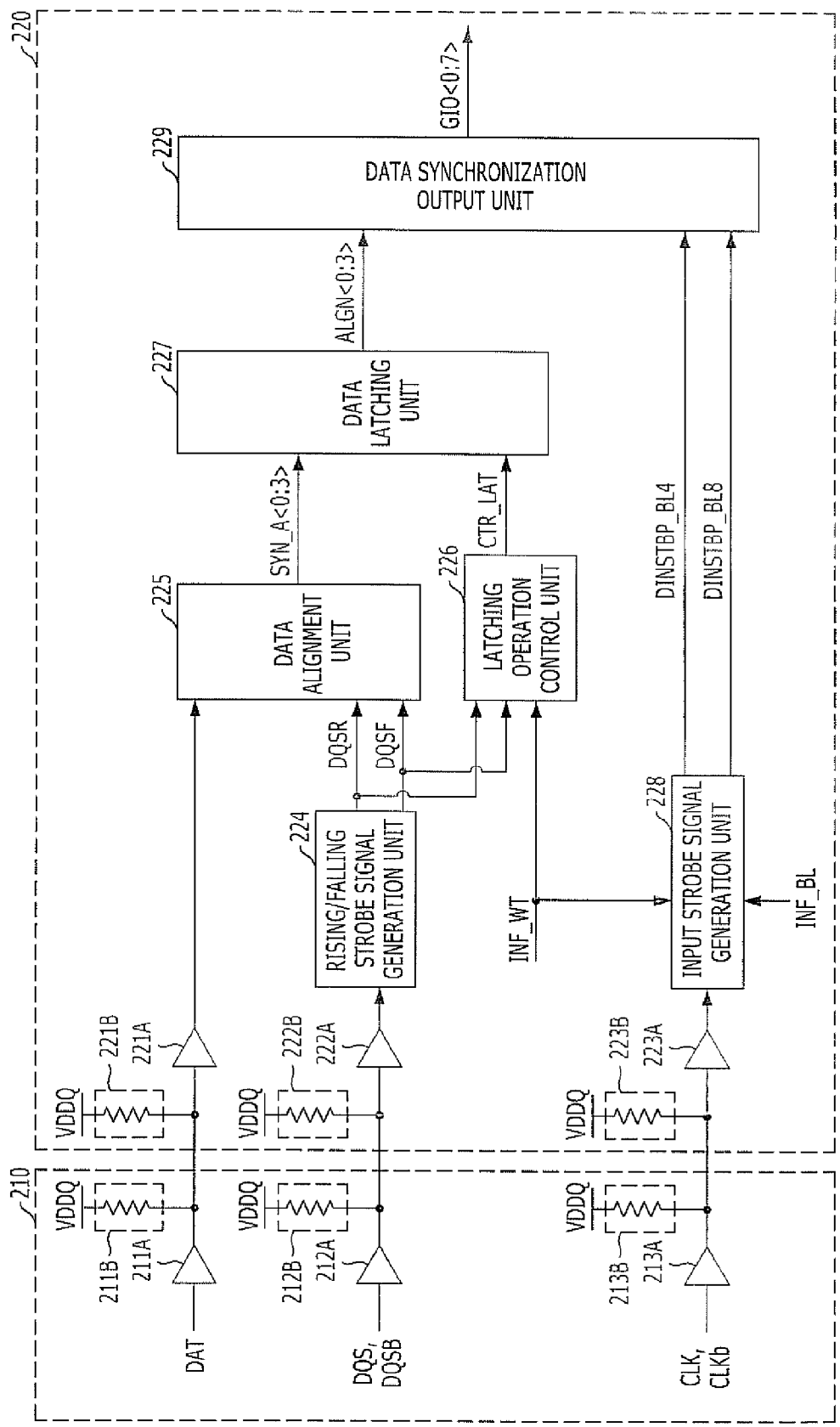
FIG. 2 is a block diagram illustrating a memory system in accordance with an exemplary embodiment of the present invention.

FIG. 2 is a block diagram illustrating a memory system in accordance with an exemplary embodiment of the present invention.

Referring to FIG. 2, the memory system includes a chipset 210 and a semiconductor memory device 220.

The chipset 210 includes first to third transmission units 211A to 213A and first to third transmission-side termination units 211B to 213B. The first transmission unit 211A is configured to transmit data DAT, the second transmission unit 212A is configured to transmit a data strobe signal DQS and a data strobe bar signal DQSB, and the third transmission unit 213A is configured to transmit an external clock signal CLK and an external clock bar signal CLKB. The first to third transmission-side termination units 211B to 213B are configured to drive the respective output signals of the first to third transmission units 211A to 213A to a termination level corresponding to a power supply voltage VDDQ. The first to third transmission-side termination units 211B to 213B may be implemented as resistors which are inserted between the power supply voltage (VDDQ) terminals and transmission lines through which the data DAT, the data strobe signal DQS, the data strobe bar signal DQSB, the external clock signal CLK, and the external clock bar signal CLKB are transmitted.

The semiconductor memory device 220 aligns the data DAT according to the signals inputted from the chipset 210, and performs a write operation. The semiconductor memory device 220 includes first to third reception units 221A to 223A and first to third reception-side termination units 221B to 223B. The first reception unit 221A is configured to receive the data DAT inputted from the chipset 210, the second reception unit 222A is configured to receive the data strobe signal DQS and the data strobe bar signal DQSB, and the third reception unit 223A is configured to receive the external clock signal CLK and the external clock bar signal CLKB. The first to third reception-side termination units 221B to 223B are configured to drive the respective input signals of the first to third reception units 221A to 223A to a termination level. The first to third reception-side termination units 221B to 223B may be implemented as resistors which are inserted between the power supply voltage (VDDQ) terminals and the transmission lines through which the data DAT, the data strobe signal DQS, the data strobe bar signal DQSB, the external clock signal CLK, and the external clock bar signal CLKB are transmitted.

The semiconductor memory device 220 includes a rising/falling strobe signal generation unit 224, a data alignment unit 225, a latching operation control unit 226, a data latching unit 227, an input strobe signal generation unit 228, and a data synchronization output unit 229.

The rising/falling strobe signal generation unit 224 is configured to receive the data strobe signal DQS and the data strobe bar signal DQSB, and generate a rising data strobe signal DQSR corresponding to the data strobe signal DQS and a falling data strobe signal DQSF corresponding to the data strobe bar signal DQSB.

Figure 3:
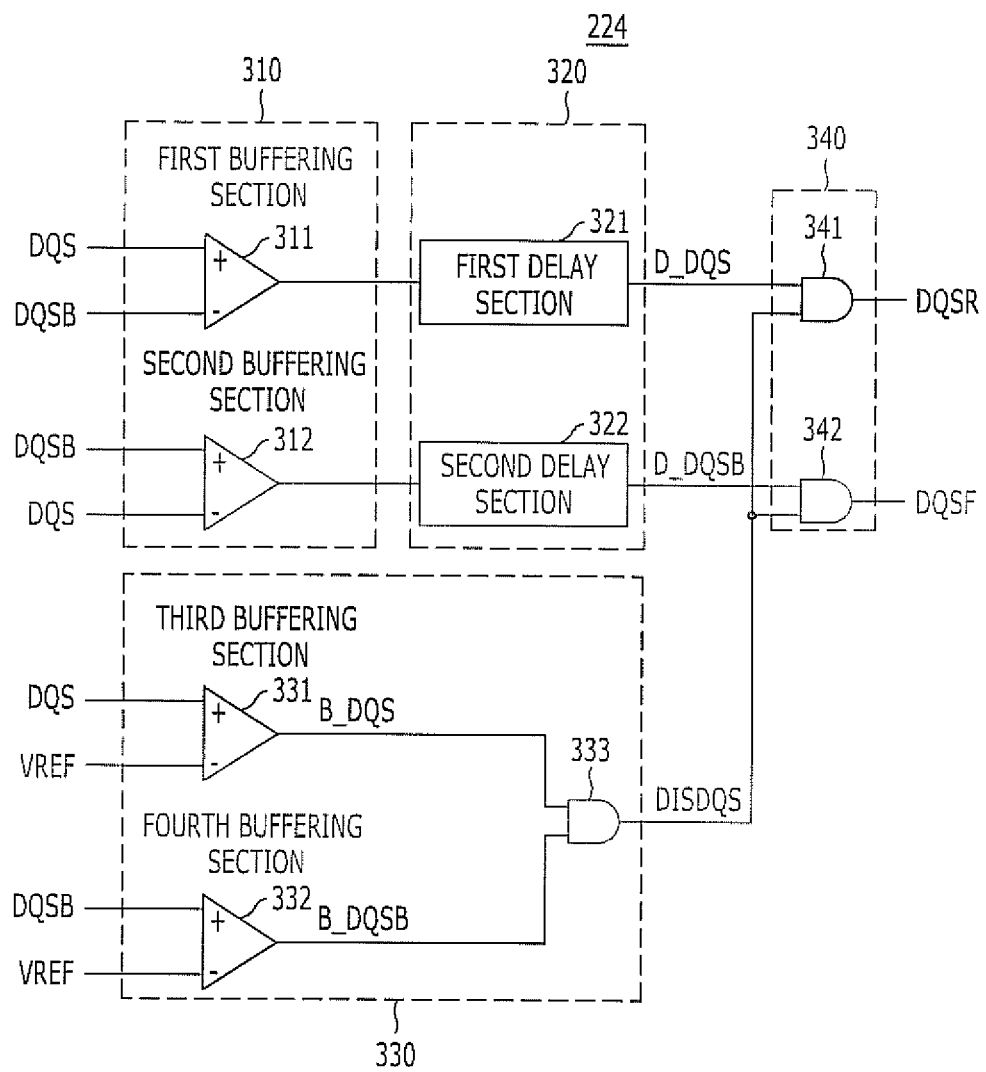
FIG. 3 is a block diagram illustrating a rising/falling strobe signal generation unit of FIG. 2.

FIG. 3 is a block diagram illustrating the rising/falling strobe signal generation unit 224 of FIG. 2.

Referring to FIG. 3, the rising/falling strobe signal generation unit 224 includes a buffer unit 310, a delay unit 320, an activation controller 330, and an output controller 340.

The buffer unit 310 is configured to buffer the data strobe signal DQS and the data strobe bar signal DQSB, and includes a first buffering section 311 and a second buffering section 312. The first buffering section 311 is configured to receive the data strobe signal DQS through a positive (+) terminal and the data strobe bar signal DQSB through a negative (−) terminal, and the second buffering section 312 is configured to receive the data strobe bar signal DQSB through a positive (+) terminal and the data strobe signal DQS through a negative (−) terminal.

The delay unit 320 is configured to delay the output signals of the buffer unit 310 by a certain time, and includes a first delay section 321 and a second delay section 322. The first delay section 321 is configured to delay the output signal of the first buffering section 311, and the second delay section 322 is configured to delay the output signal of the second buffering section 312. The first and second delay sections 321 and 322 serve to compensate for a delay in generating a period control signal DISDQS which is described below.

The activation controller 330 is configured to compare the data strobe signal DQS and the data strobe bar signal DQSB with a reference voltage VREF, and generate a period control signal DISDQS corresponding to the comparison result. The activation controller 330 includes a third buffering section 331, a fourth buffering section 332, and an output section 333. The third buffering section 331 is configured to receive the data strobe signal DQS through a positive (+) terminal and the reference voltage VREF through a negative (−) terminal. The fourth buffering section 332 is configured to receive the data strobe bar signal DQSB through a positive (+) terminal and the reference voltage VREF through a negative (−) terminal. The output section 333 is configured to generate the period control signal DISDQS in response to the signals B_DQS and B_DQSB outputted from the third and fourth buffering sections 331 and 332, respectively. For example, the output section 333 may be an AND gate that performs an AND operation on the signals B_DQS and B_DQSB and outputs the period control signal DISDQS. The reference voltage VREF is used for discriminating and outputting the data strobe signal DQS and the data strobe bar signal DQSB. The reference voltage VREF may have a voltage level corresponding to ½ of the swing width of the data strobe signal DQS and the data strobe bar signal DQSB.

The output controller 340 is configured to limit the output signals D_DQS and D_DQSB outputted from the first and second delay sections 321 and 322, respectively, in response to the period control signal DISDQS, and output the limited signals as a rising data strobe signal DQSR and a falling data strobe signal DQSF. The output controller 340 includes a first output section 341 and a second output section 342. The first output section 341 is configured to receive the output signal D_DQS of the first delay section 321 and the period control signal DISDQS, and output the rising data strobe signal DQSR. For example, the first output section 341 may be an AND gate that performs an AND operation on the output signal D_DQS of the first delay section 321 and the period control signal DISDQS, and outputs the rising data strobe signal DQSR. The second output section 342 is configured to receive the output signal D_DQSB of the second delay section 322 and the period control signal DISDQS, and output the falling data strobe signal DQSF. For example, the second output section 342 may be an AND gate that performs an AND operation on the output signal D_DQSB of the second delay section 322 and the period control signal DISDQS, and outputs the falling data strobe signal DQSF.

Figure 4:
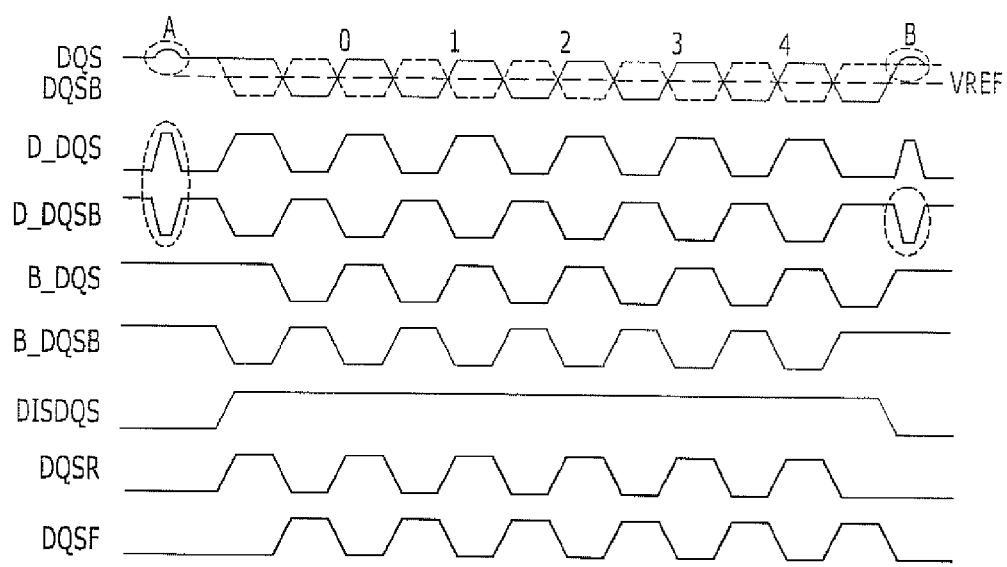
FIG. 4 is a waveform diagram illustrating an operation of the rising/falling strobe signal generation unit of FIG. 3.

FIG. 4 is a waveform diagram illustrating an operation of the rising/falling strobe signal generation unit 224 of FIG. 3. In FIG. 4, a mode in which the data strobe signal DQS and the data strobe bar signal DQSB toggle one time during a preamble period is taken as an example. For reference, as described above, the memory system in accordance with an exemplary embodiment of the present invention performs a transmission/reception operation at a termination level corresponding to a power supply voltage. In this case, noises A and B may occur in the data strobe signal DQS and the data strobe bar signal DQSB. Therefore, the semiconductor memory device 220 in accordance with an exemplary embodiment of the present invention includes the activation controller 330 which may substantially prevent the occurrence of the noises A and B in the rising and falling data strobe signals DQSR and DQSF.

In an idle state, the data strobe signal DQS and the data strobe bar signal DQSB maintain a termination level corresponding to the power supply voltage. After a preamble period, the data strobe signal DQS and the data strobe bar signal DQSB start to toggle with data. Then, referring to FIGS. 3 and 4, the first buffering section 311 and the second buffering section 312 buffer the data strobe signal DQS and the data strobe bar signal DQSB. At this time, the noises A and B may cause an undesired pulse to occur in the output signals D_DQS and D_DQSB of the first and second delay sections 321 and 322, respectively.

Meanwhile, the third and fourth buffering sections 331 and 332 of the activation controller 330 compare the data strobe signal DQS and the data strobe bar signal DQSB with the reference voltage VREF, and the output section 333 generates the period control signal DISDQS in response to the output signal B_DQS of the third buffering section 331 and the output signal B_DQSB of the fourth buffering section 332. The output controller 340 outputs the output signal D_DQS of the first delay section 321 as the rising data strobe signal DQSR and outputs the output signal D_DQSB of the second delay section 322 as the falling data strobe signal DQSF, during an activation period of the period control signal DISDQS. In other words, the toggling operation of the output signal D_DQS of the first delay section 321 and the output signal D_DQSB of the second delay section 322 are limited by the period control signal DISDQS. As a result, the undesired pulse caused by the noises A and B is not reflected in the rising data strobe signal DQSR and the falling data strobe signal DQSF.

Referring to FIG. 2, the data alignment unit 225 is configured to align the data DAT, which are sequentially inputted through the first reception unit 221A, in response to the rising data strobe signal DQSR and the falling data strobe signal DQSF.

Figure 5:
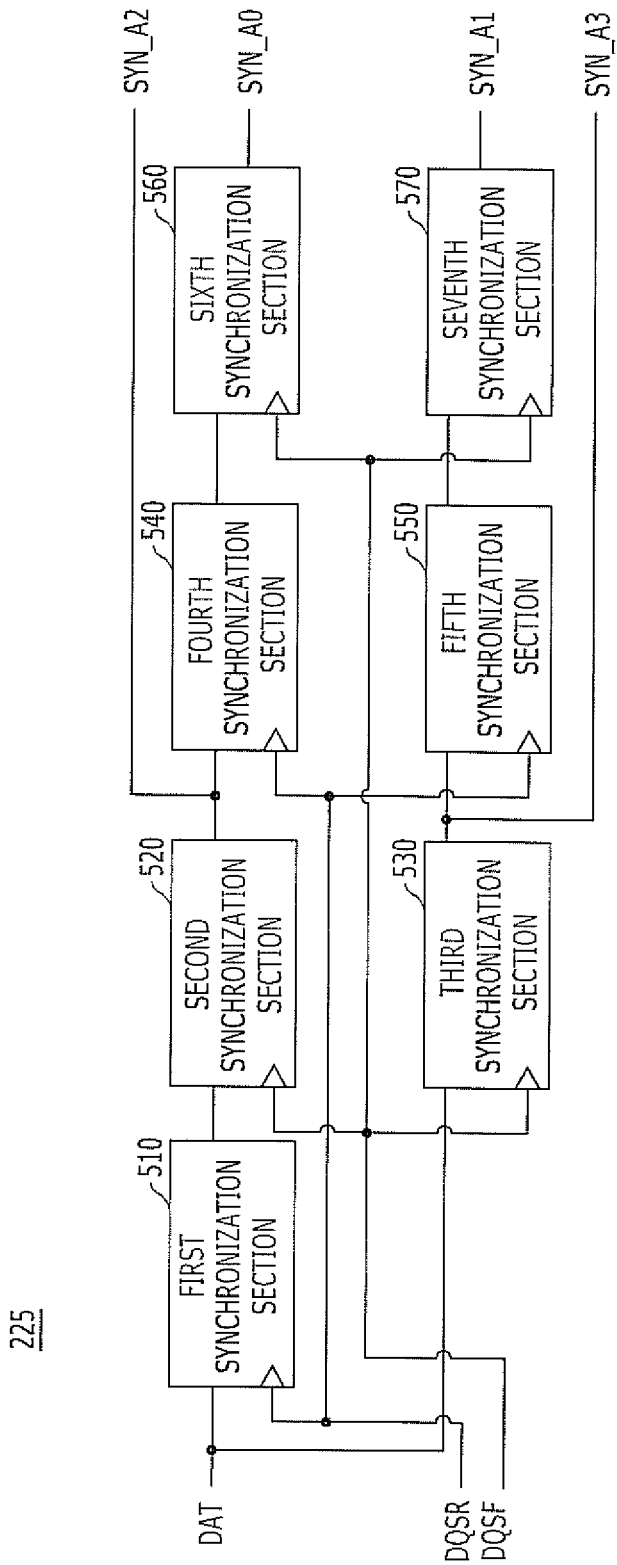
FIG. 5 is a block diagram illustrating a data alignment unit of FIG. 2.

FIG. 5 is a block diagram illustrating the data alignment unit 225 of FIG. 2.

Referring to FIGS. 2 and 5, the data alignment unit 225 includes first to seventh synchronization sections 510 to 570 configured to shift the data DAT in response to the rising data strobe signal DQSR and the falling data strobe signal DQSF. Each of the synchronization sections 510 to 570 may include a flip-flop. The respective synchronization sections 510 to 570 synchronize and output the inputted data in response to the rising data strobe signal DQSR or the falling data strobe signal DQSF.

In other words, the first synchronization section 510 synchronizes and outputs a first data of the data DAT in response to the rising data strobe signal DQSR. Then, the second synchronization section 520 synchronizes the output signal of the first synchronization section 510 in response to the falling data strobe signal DQSF, and outputs a second synchronization signal SYN_A2. At this time, the third synchronization section 530 synchronizes a second data (i.e., the next data following the first data) of the data DAT in response to the falling data strobe signal DQSF, and outputs a third synchronization signal SYN_A3. The fourth and fifth synchronization sections 540 and 550 receive the outputs of the second and third synchronization sections 520 and 530, respectively, and synchronize and output the inputted signals in response to the rising data strobe signal DQSR. The sixth and seventh synchronization sections 560 and 570 receive the outputs of the fourth and fifth synchronization sections 540 and 550, respectively, and synchronize and output the inputted signals in response to the falling data strobe signal DQSF. The output of the sixth synchronization section 560 is a zeroth synchronization signal SYN_A0 and the output of the seventh synchronization section 570 is a first synchronization signal SYN_A1. Such a circuit operation of the data alignment unit 225 is described below in more detail with reference to FIG. 8.

Referring to FIG. 2, the latching operation control unit 226 is configured to count the rising data strobe signal DQSR and the falling data strobe signal DQSF generated by the rising/falling strobe signal generation unit 224 during an interval between a write operation and a next write operation, and generate a latching control signal CTR_LAT. The latching operation control unit 226 may be implemented with a variety of components. For example, the latching operation control unit 226 may include a counter configured to count the rising data strobe signal DQSR and the falling data strobe signal DQSF in response to write information INF_WT activated during the first write operation and write information INF_WT activated during the second write operation. The operation waveform of the latching control signal CTR_LAT generated by the latching operation control unit 226 is described below with reference to FIG. 8. In order to decrease skew between the data DAT and the data strobe signal DQS, the latching control signal CTR_LAT may be synchronized with the falling data strobe signal DQSF, and then outputted.

The data latching unit 227 is configured to latch the zeroth to third synchronization signals SYN_A<0:3>, which are outputted from the data alignment unit 225, in response to the latching control signal CTR_LAT. The semiconductor memory device in accordance with an exemplary embodiment of the present invention includes the latching operation control unit 226 and the data latching unit 227. Therefore, the data DAT, which are sequentially inputted, may be latched at a point in time when the alignment operation is terminated.

Figure 6:
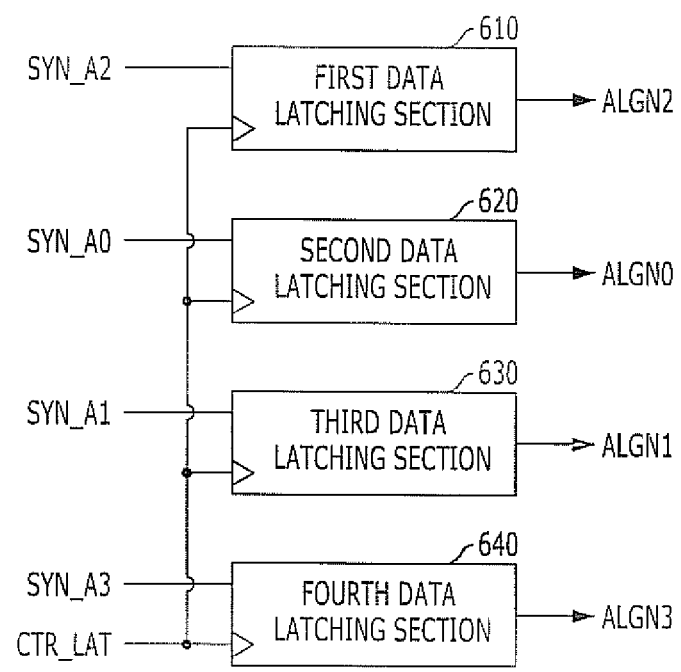
FIG. 6 is a block diagram illustrating a data latching unit of FIG. 2.

FIG. 6 is a block diagram explaining the data latching unit 227 of FIG. 2.

Referring to FIGS. 2 and 6, the data latching unit 227 includes first to fourth data latching sections 610 to 640. The first data latching section 610 is configured to latch the second synchronization signal SYN_A2 in response to the latching control signal CTR_LAT, and output a second alignment signal ALGN2. The second data latching section 620 is configured to latch the zeroth synchronization signal SYN_A0 in response to the latching control signal CTR_LAT, and output a zeroth alignment signal ALGN0. The third data latching section 630 is configured to latch the first synchronization signal SYN_A1 in response to the latching control signal CTR_LAT, and output a first alignment signal ALGN1. The fourth data latching section 640 is configured to latch the third synchronization signal SYN_A3 in response to the latching control signal CTR_LAT, and output a third alignment signal ALGN3. The circuit operation of the data latching unit 227 is described in more detail with reference to FIG. 8.

Referring to FIG. 2, the input strobe signal generation unit 228 is configured to generate first and second data input strobe signals DINSTBP_BL4 and DINSTBP_BL8 in response to the write information INF_WT which is activated during the write operation. The first and second data input strobe signals DINSTBP_BL4 and DINSTBP_BL8 correspond to the external clock signals CLK and CLKB and include burst length information INF_BL.

The data synchronization output unit 229 is configured to synchronize the zeroth to third alignment signals ALGN<0:3> outputted from the data latching unit 227 in response to the first and second data input strobe signals DINSTBP_BL4 and DINSTBP_BL8, and output the synchronized signals to the plurality of global data lines GIO<0:7>.

Figure 7:
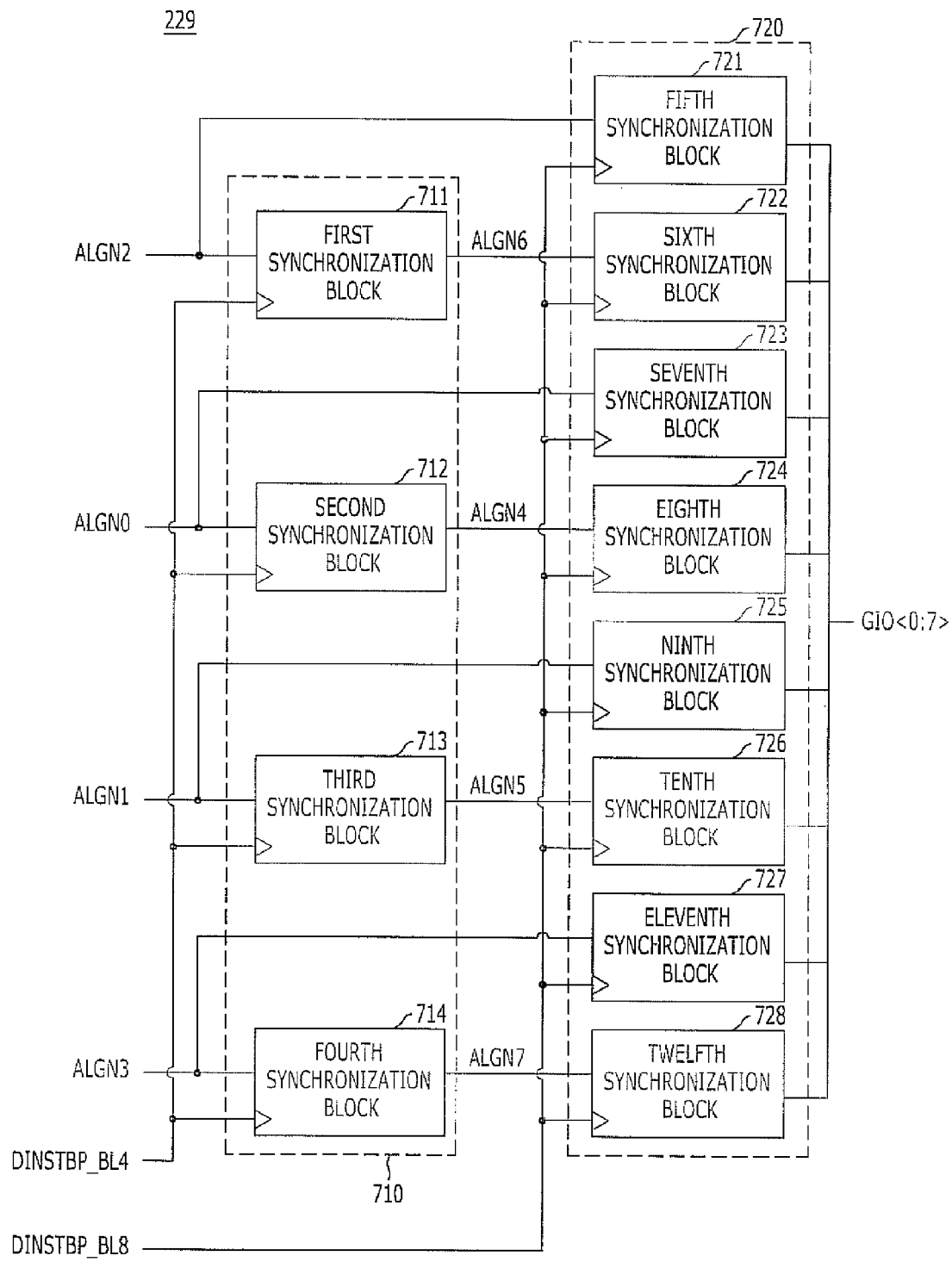
FIG. 7 is a block diagram illustrating a data synchronization output unit of FIG. 2.

FIG. 7 is a block diagram illustrating the data synchronization output unit 229 of FIG. 2.

Referring to FIGS. 2 and 7, the data synchronization output unit 229 includes a first synchronization group 710 and a second synchronization group 720. The first synchronization group 710 is configured to synchronize the zeroth to third alignment signals ALGN<0:3> in response to the first data input strobe signal DINSTBP_BL4, and output fourth to seventh alignment signals ALGN<4:7>. The second synchronization group 720 is configured to synchronize the zeroth to third alignment signals ALGN<0:3> and the fourth to seventh alignment signals ALGN<4:7> in response to the second data input strobe signal DINSTBP_BL8, and output the synchronized signals to the plurality of global data line GIO<0:7>.

The first synchronization group 710 includes first to fourth synchronization blocks 711 to 714, which are configured to synchronize the zeroth to third alignment signals ALGN<0:3> in response to the first data input strobe signal DINSTBP_BL4, and output the fourth to seventh alignment signals ALGN<4:7>. The second synchronization group 720 includes fifth to twelfth synchronization blocks 721 to 728, which are configured to synchronize the zeroth to seventh alignment signals ALGN<0:7> in response to the second data input strobe signal DINSTBP_BL8, and output the synchronized signals to the global data lines GIO<0:7>.

Figure 8:
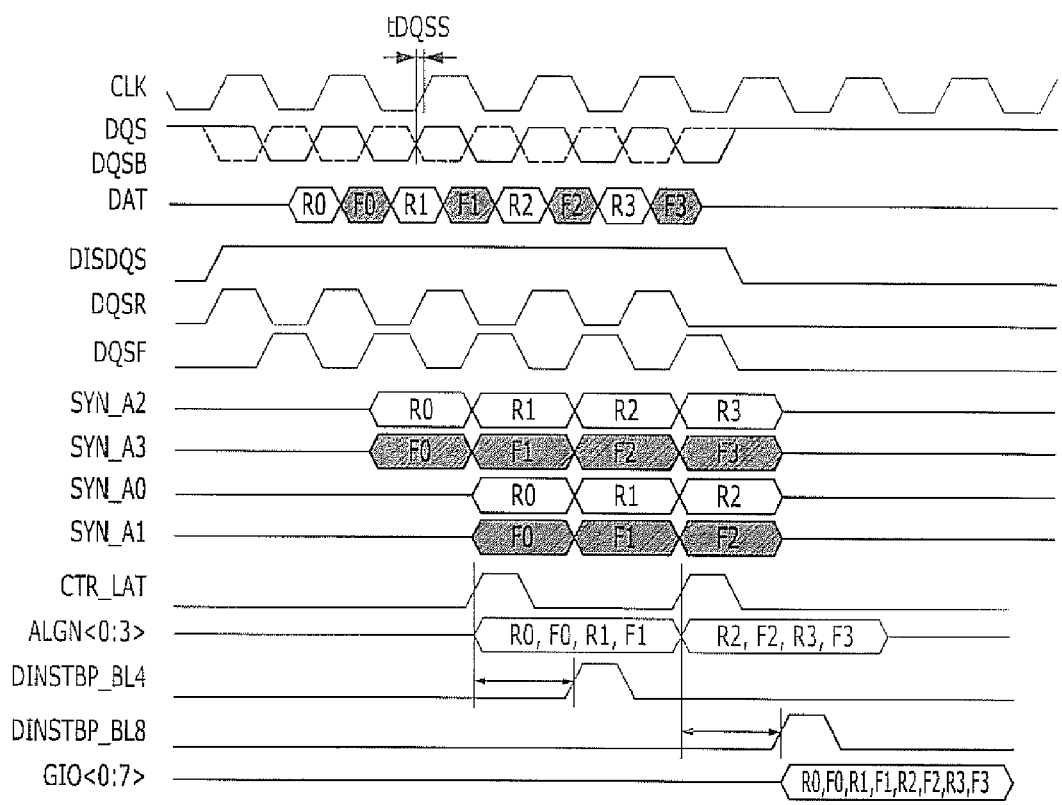
FIG. 8 is a timing diagram illustrating the effects of a write operation on signals of a semiconductor memory device of FIG. 2.

FIG. 8 is a timing diagram illustrating the effects of the write operation on signals of the semiconductor memory device of FIG. 2. In FIG. 8, a case in which the data strobe signal DQS and the data strobe bar signal DQSB toggle one time during a preamble period is taken as an example.

Referring to FIGS. 2 and 8, the semiconductor memory device 220 receives the external clock signal CLK, the data strobe signal DQS, the data strobe bar signal DQSB, and the data DAT from the external chipset 210. The circuit and operation for generating the rising data strobe signal DQSR and the falling data strobe signal DQSF by using the data strobe signal DQS and the data strobe bar signal DQSB have been described with reference to FIGS. 3 and 4. Therefore, the descriptions thereof will be omitted.

Hereinafter, an operation of the data alignment unit 225 is described. Further, herein, the data DAT includes, for example, the following data consecutively inputted in sequence: first data R0, second data F0, third data R1, fourth data F1, fifth data R2, sixth data F2, seventh data R3, and eighth data F3. The data alignment unit 225 aligns the data DAT, which are consecutively inputted, in response to the rising data strobe signal DQSR and the falling data strobe signal DQSF. That is, the first data R0 and the second data F0 are outputted as the second and third synchronization signals SYN_A2 and SYN_A3 in response to the rising data strobe signal DQSR and the falling data strobe signal DQSF, respectively. Then, the second and third synchronization signals SYN_A2 and SYN_A3 are outputted as the zeroth and first synchronization signals SYN_A0 and SYN_A1 in response to the rising data strobe signal DQSR and the falling data strobe signal DQSF, respectively, while the third data R1 and the fourth data F1 are outputted as the zeroth and first synchronization signals SYN_A0 and SYN_A1, respectively.

At this time, the semiconductor memory device 220 in accordance with an exemplary embodiment of the present invention counts the rising data strobe signal DQSR or the falling data strobe signal DQSF to generate the latching control signal CTR_LAT, and the data latching unit 227 latches the zeroth to third synchronization signals SYN_A<0:3> and outputs them to the zeroth to third alignment signals ALGN<0:3> in response to the latching control signal CTR_LAT. When the first data input strobe signal DINSTBP_BP4 is activated, the zeroth to third alignment signals ALGN<0:3> are latched by the data synchronization output unit 229.

The data R2, F2, R3, and F3 are synchronized with the rising data strobe signal DQSR and the falling data strobe signal DQSF and outputted to the zeroth to third alignment signals ALGN<0:3> in a similar manner as described above. Then, the data synchronization output unit 229 latches the data R2, F2, R3, and F3 in response to the second data input strobe signal DINSTBP_BL8. As a result, the data R0, F0, R1, F1, R2, F2, R3, and F3 are outputted to the plurality of global data lines GIO<0:7> in response to the second data input strobe signal DINSTBP_BL8.

As shown in FIG. 8, the data R0, F0, R1, and F1 are latched in the zeroth to third alignment signals ALGN<0:3> for a sufficient time. Therefore, a sufficient time margin for activating the first data input strobe signal DINSTBP_BL4 is provided. Furthermore, since the data R2, F2, R3, and F3 are latched in the zeroth to third alignment signals ALGN<0:3> for a sufficient time, a sufficient time margin for activating the second data input strobe signal DINSTBP_BL8 is provided. Therefore, the semiconductor memory device 220 in accordance with an exemplary embodiment of the present invention may compensate for tDQSS by providing such a sufficient time margin. Accordingly, the aligned data may be stably outputted to the plurality of global data lines GIO<0:7>.

Recently, semiconductor memory devices are designed in such a manner as to perform a variety of operations depending on various requests. Such requests may include information on how many times the data strobe signal DQS and the data strobe bar signal DQSB toggle during the preamble period, whether cyclic redundancy check (CRC) data is inputted or not, and so on. The semiconductor memory devices should be designed in such a manner as to satisfy such requests. A semiconductor memory device in accordance with another exemplary embodiment of the present invention, which is described below, may perform a write operation in which such requests are accommodated.

Figure 9:
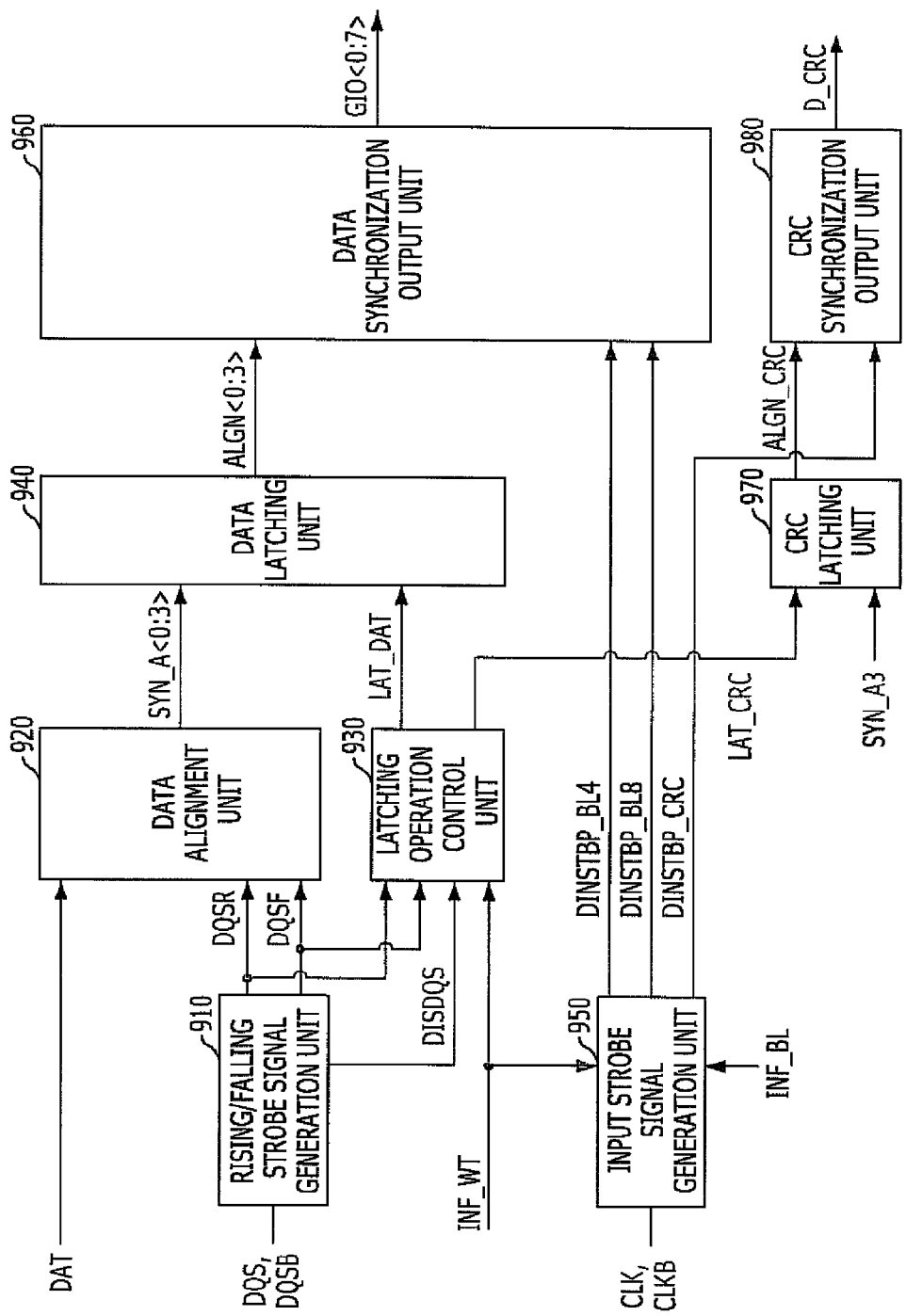
FIG. 9 is a block diagram illustrating a portion of a semiconductor memory device in accordance with another exemplary embodiment of the present invention.

FIG. 9 is a block diagram illustrating a portion of a semiconductor memory device in accordance with another exemplary embodiment of the present invention.

Referring to FIG. 9, the semiconductor memory device includes a rising/falling strobe signal generation unit 910, a data alignment unit 920, a latching operation control unit 930, a data latching unit 940, an input strobe signal generation unit 950, a data synchronization output unit 960, a CRC latching unit 970, and a CRC synchronization output unit 980. The rising/falling strobe signal generation unit 910, the data alignment unit 920, the data latching unit 940, the input strobe signal generation unit 950, and the data synchronization output unit 960 are configured in the same manner as the components of FIG. 2. Therefore, detailed descriptions of the circuit configurations and operations thereof are omitted. Hereafter, the following descriptions focus on different components than those of FIG. 2, except that the input strobe signal generation unit 950 is further discussed. In particular, the input strobe signal generation unit 950 activates a CRC input strobe signal DINSTBP_CRC corresponding to CRC data in a CRC mode in which the CRC data is inputted. The CRC input strobe signal DINSTBP_CRC is transferred to the CRC synchronization output unit 980.

Meanwhile, the latching operation control unit 930 counts a rising data strobe signal DQSR and a falling data strobe signal DQSF depending on the operation mode during a write operation, and generates a data latching control signal LAT_DAT and a CRC latching control signal LAT_CRC. Further, the latching operation control unit 930 additionally receives a period control signal DISDQS, which is used when the rising/falling strobe signal generation unit 910 generates the rising data strobe signal DQSR and the falling data strobe signal DQSF.

Figure 10:
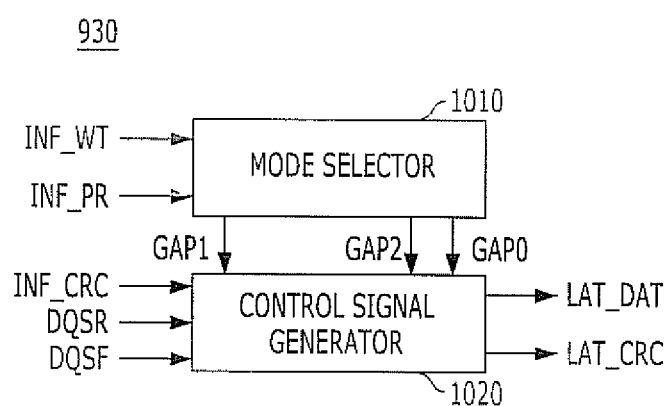
FIG. 10 is a block diagram illustrating a latching operation control unit of FIG. 9.

FIG. 10 is a block diagram illustrating the latching operation control unit 930 of FIG. 9.

Referring to FIGS. 9 and 10, the latching operation control unit 930 includes a mode selector 1010 and a control signal generator 1020.

The mode selector 1010 is configured to generate zeroth to second mode selection signals GAP0 to GAP2 in response to write information INF_WT and preamble information INF_PR, which is operation mode information. More specifically, the mode selector 1010 generates the zeroth to second mode selection signals GAP0 to GAP2 in response to the write information INF_WF activated during the write operation and the preamble information INF_PR, which corresponds to how many times a data strobe signal DQS and a data strobe bar signal DQSB toggle during the preamble period.

Figure 11:
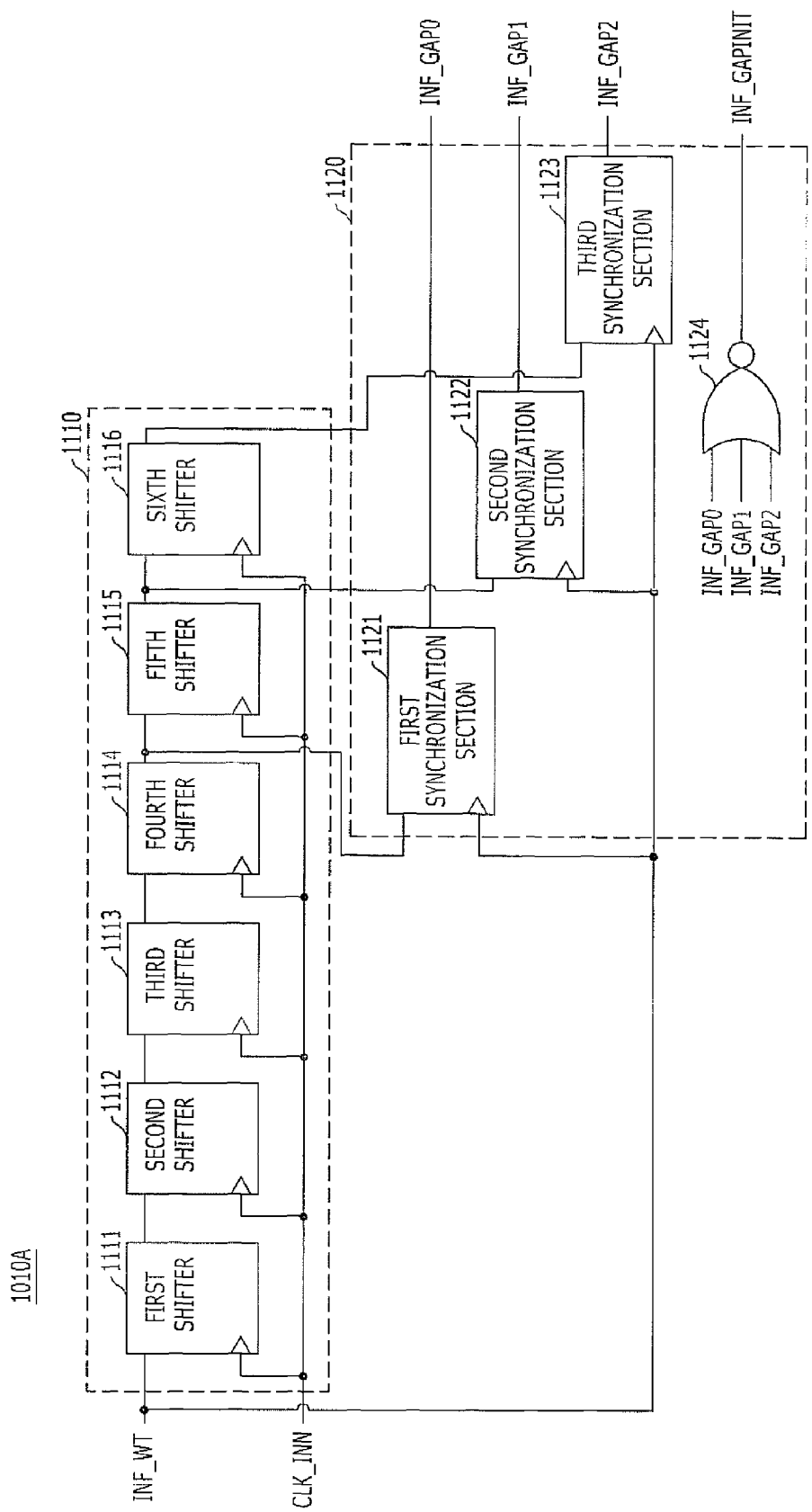
FIG. 11 is a block diagram and FIG. 12 is a circuit diagram which together illustrate a mode selector of FIG. 10.
Figure 12:
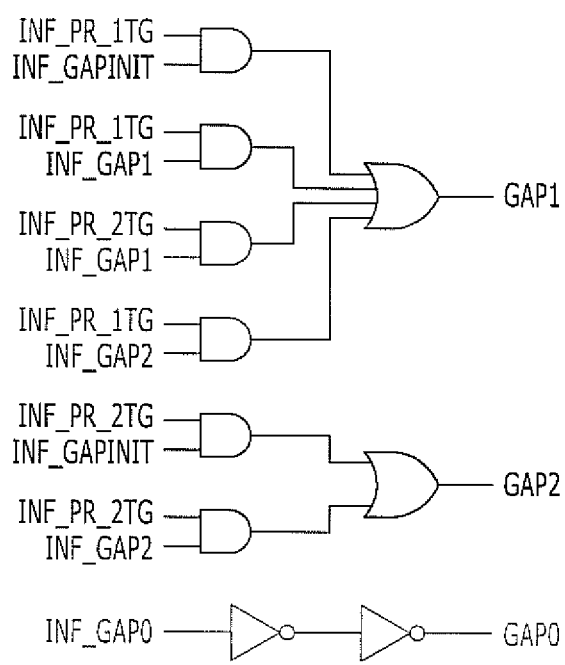

FIGS. 11 and 12 are circuit diagrams illustrating the mode selector 1010 of FIG. 10.

Referring to FIG. 11, the mode selector 1010 includes an information generator 1010A configured to receive the write information INF_WT and generate zeroth to third additional write interval information INF_GAP0, INF_GAP1, INF_GAP2, and INF_GAPINIT. The information generator 1010A includes a shifting section 1110 and an information output section 1120. An additional write interval is a time calculated by subtracting tCCD from a time between a first write command and a second write command, where tCCD is a minimum interval required to perform the write operation and is measured in units of cycles of the external clock (i.e., one unit is 1 tCK).

Hereafter, a case in which tCCD is 4 will be taken as an example, for convenience of description.

When tCCD is 4, a write command is ideally inputted at an interval of 4 tCK. That is, ideally 4 cycles of the external clock (4 tCK) elapse between a write operation and a next write operation. However, although the tCCD is 4, the write command may be inputted at an interval of 5 or 6 tCK. When the write command is inputted at an interval of 5 tCK, the additional write interval becomes 1. When the write command is inputted at an interval of 6 tCK, the additional write interval becomes 2. Accordingly, when the zeroth additional write interval information INF_GAP0 is active, it means that the additional write interval is 0 and the write command is inputted at an interval of 4 tCK. When the first additional write interval information INF_GAP1 is active, it means that the additional write interval is 1 tCK. When the second additional write interval information INF_GAP2 is active, it means that the additional write interval is 2 tCK.

Meanwhile, the shifting section 1110 of the information generator 1010A includes first to sixth shifters 1111 to 1116. The first shifter 1111 is configured to shift the write information INF_WT in response to an internal clock signal CLK_INN. The second to sixth shifters 1112 to 1116 are configured to receive an output signal of a previous shifter, shift the received signal in response to the internal clock signal CLK_INN, and output the shifted signal. The internal clock signal CLK_INN is a clock signal corresponding to the external clock signal CLK.

The information output section 1120 includes first to third synchronization sections 1121 to 1123 and an output section 1124. The first to third synchronization sections 1121 to 1123 are configured to synchronize the output signals of the fourth to sixth shifters 1114 to 1116, respectively, in response to the write information INF_WT. Further, the first to third synchronization sections 1121 to 1123 output the synchronized signals as the zeroth to second additional write information INF_GAP0, INF_GAP1, and INF_GAP2, respectively. The output section 1124 is configured to output the third additional write interval information INF_GAPINIT in response to the zeroth to second additional write information INF_GAP0, INF_GAP1, and INF_GAP2. For example, the output section 1124 may be implemented with a NOR gate that performs a NOR operation on the zeroth to second additional write information INF_GAP0 to INF_GAP2 and outputs the third additional write interval information INF_GAPINIT.

In such a structure, the case in which tCCD is 4 was taken as an example. Therefore, when a next write command is inputted at 4 tCK after a first write command is inputted, the zeroth additional write interval information INF_GAP0 is activated. However, when a next write command is inputted after 5 tCK, the first additional write interval information INF_GAP1 is activated. Or, when a next write command is inputted after 6 tCK, the second additional write interval information INF_GAP2 is activated. In other words, when the zeroth additional write interval information INF_GAP0 is active, it means that the interval between the first write command and the second write command is tCCD, which is the minimum interval. When the first additional write interval information INF_GAP1 is active, it means that the interval between the first write command and the second write command is tCCD+1 tCK. When the second additional write interval information INF_GAP2 is active, it means that the interval between the first write command and the second write command is tCCD+2 tCK. Finally, when the third additional write interval information INF_GAPINIT is active, it means that the interval between the first write command and the second write command is equal to or more than tCCD+3 tCK.

Referring to FIGS. 10 and 12, the mode selector 1010 includes a decoder 1010B configured to decode the zeroth to third additional write interval information INF_GAP0, INF_GAP1, INF_GAP2, and INF_GAPINIT and the preamble information INF_PR, which is the operation mode information, and generate zeroth to second mode selection signals GAP0 to GAP2. The preamble information INF_PR is a signal outputted from a mode resistor set (not shown), and may include first preamble information INF_PR_1TG and second preamble information INF_PR_2TG. When the rising data strobe signal DQSR and the falling data strobe signal DQSF are to toggle one time during the preamble period, the first preamble information INF_PR_1TG is activated and inputted. When the rising data strobe signal DQSR and the falling data strobe signal DQSF are to toggle two times during the preamble period, the second preamble information INF_PR_2TG is activated and inputted.

That is, the decoder 1010B receives and decodes the zeroth to third additional write interval information INF_GAP0, INF_GAP1, INF_GAP2, and INF_GAPINIT and the first and second preamble information INF_PR_1TG and INF_PR_2TG, and activates a corresponding mode selection signal among the zeroth to second mode selection signals GAP0 to GAP2.

Referring to FIG. 10, the control signal generator 1020 is controlled by the zeroth to third mode selection signals GAP0 to GAP2, and generates a data latching control signal LAT_DAT and a CRC latching control signal LAT_CRC in response to the rising data strobe signal DQSR and the falling data strobe signal DQSF.

Figure 13:
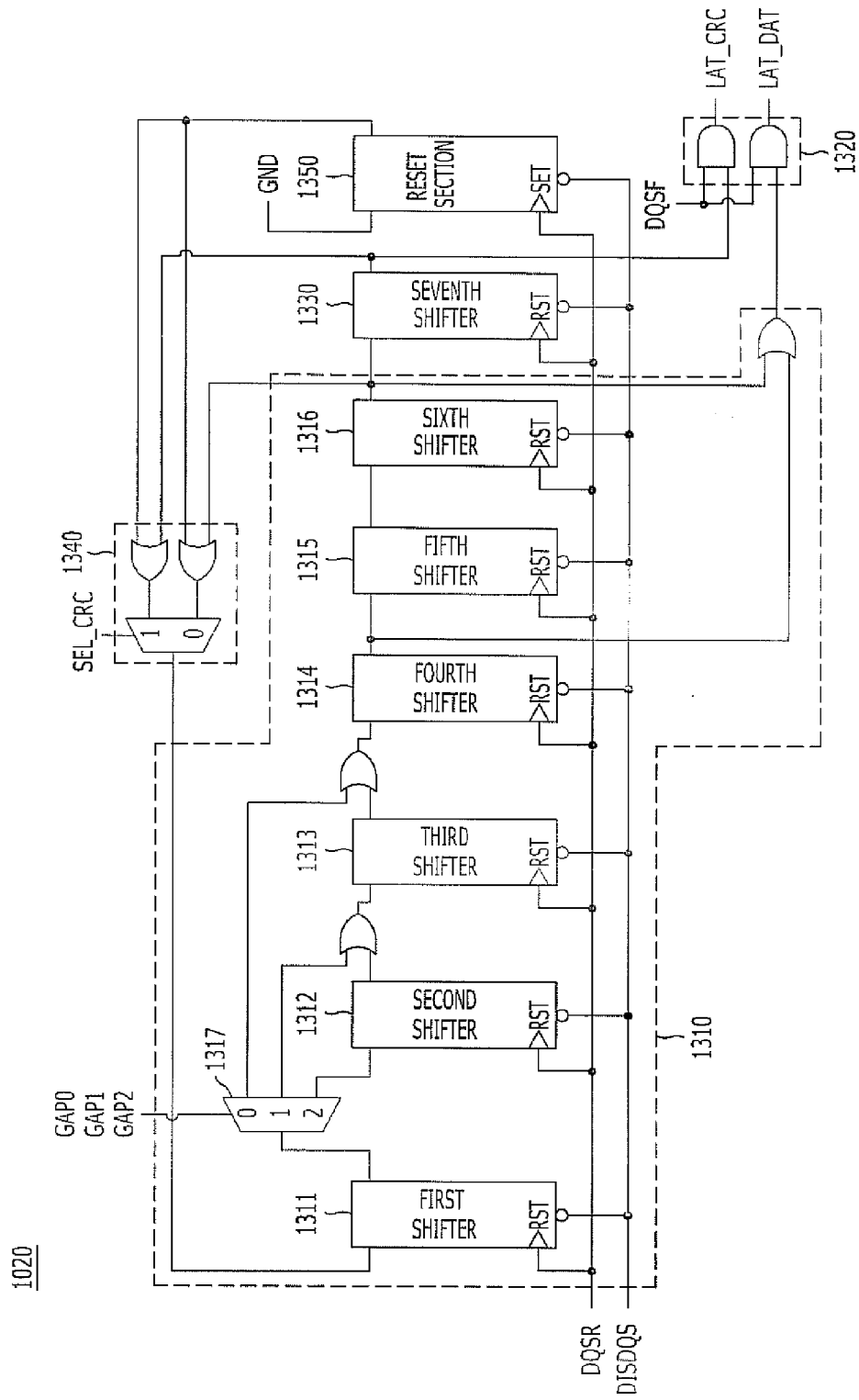
FIG. 13 is a block diagram illustrating a control signal generator of FIG. 10.

FIG. 13 is a diagram illustrating the control signal generator 1020 of FIG. 10.

Referring to FIGS. 10 and 13, the control signal generator 1020 includes a path control shifting section 1310, a control signal output section 1320, a CRC shifting section 1330, a feedback section 1340, and a reset section 1350.

The path control shifting section 1310 is configured to set shifting paths corresponding to the zeroth to second mode selection signals GAP0 to GAP2, and perform a shifting operation through the set shifting paths in response to the rising data strobe signal DQSR. The path control shifting section 1310 includes first to sixth shifters 1311 to 1316 for shifting data and a path setting section 1317.

The first shifter 1311 is configured to receive an output signal of the feedback section 1340 and shift the received signal in response to the rising data strobe signal DQSR. The first shifter 1311 then outputs the shifted signal to the path setting section 1317. The path setting section 1317 sets the shifting paths in response to the zeroth to second mode selection signals GAP0 to GAP2. More specifically, the path setting section 1317 outputs the shifted signal output from the first shifter 1311 to a first path, second path, or third path according to the zeroth mode selection signals GAP0 to GAP2. The first path is a transmission line to the input of the second shifter 1312. The second path is a transmission line to a first logic gate (e.g., an OR gate) for combining an output signal of the second shifter and the output of the first shifter 1311. The first logic gate then outputs the result of the combination to the third shifter 1313. The third path is a transmission line to a second logic gate (e.g., an OR gate) for combining an output signal of the third shifter 1313 and the output of the first shifter 1311. The second logic gate then outputs the result of the combination to the fourth shifter 1314. The fourth shifter 1314 outputs a signal to the fifth shifter 1315, and the fifth shifter 1315 outputs a signal to the sixth shifter 1316. The first to sixth shifters 1311 to 1316 perform a reset operation in response to the period control signal DISDQS.

The control signal output section 1320 is configured to synchronize the output signal of the fourth shifter 1314 and the output signal of the sixth shifter 1316 with the falling data strobe signal DQSF, and output a data latching control signal LAT_DAT. Also, the control signal output section 1320 synchronizes the output signal of the CRC shifting section 1330, which may be implemented with a seventh shifter, with the falling data strobe signal DQSF, and outputs a CRC latching control signal LAT_CRC. This is an operation corresponding to the CRC mode, and is described below in more detail.

Hereafter, the circuit operation of the control signal generator 1020 in accordance with an exemplary embodiment of the present invention is described.

First, when the zeroth mode selection signal GAP0 is activated, the output signal of the first shifter 1311 is outputted to the third path via an output terminal '0' of the path setting section 1317, and then inputted to the fourth shifter 1314. The fourth shifter 1314 shifts the inputted signal in response to the rising data strobe signal DQSR. The shifted signal is inputted to the control signal output section 1320, and outputted as the data latching control signal LAT_DAT in response to the falling data strobe signal DQSF. The output signal of the fourth shifter 1314 is shifted by the fifth and sixth shifters 1315 and 1316. The signal shifted by the sixth shifter 1316 is inputted to the control signal output section 1320, and outputted as the data latching control signal LAT_DAT in response to the falling data strobe signal DQSF. That is, the data latching control signal LAT_DAT is activated two times during the toggling period of the rising data strobe signal DQSR and the falling data strobe signal DQSF corresponding to one write command.

When the first mode selection signal GAP1 is activated, the output signal of the first shifter 1311 is outputted to the second path via an output terminal '1' of the path setting section 1317, and inputted to the third shifter 1313. Then, the signal shifted by the third shifter 1313 passes through the fourth shifter 1314, and activates the data latching control signal LAT_DAT. Furthermore, the signal passes through the fifth and sixth shifters 1315 and 1316, and activates the data latching control signal LAT_DAT one more time.

Finally, when the second mode selection signal GAP2 is activated, the output signal of the first shifter 1311 is outputted to the first path via an output terminal '2' of the path setting section 1317, and inputted to the second shifter 1312. Then, the signal shifted by the second shifter 1312 passes through the third to sixth shifters 1313 to 1316, and activates the data latching control signal LAT_DAT two times.

As described above, the path setting section 1317 sets the shifting paths in response to the zeroth to second mode selection signals GAP0 to GAP2. Accordingly, the number of shifters operating within a certain interval may be adjusted. As a result, the activation time of the data latching control signal LAT_DAT may be controlled according to the zeroth to second mode selection signals GAP0 to GAP2.

Meanwhile, when the CRC mode is requested, the semiconductor memory device in accordance with an exemplary embodiment of the present invention may perform a corresponding operation. In order to perform such an operation, the CRC shifting section 1330 and the feedback section 1340 are additionally provided.

The CRC shifting section 1330 is configured to synchronize the output signal of the sixth shifter 1316 with the rising data strobe signal DQSR, and output the synchronized signal to the feedback section 1340 and the control signal output section 1320. The CRC shifting section 1330 includes a seventh shifter 1330, which is reset in response to the period control signal DISDQS. When the semiconductor memory in accordance with an exemplary embodiment of the present invention performs the CRC mode, the control signal output section 1320 synchronizes the output signal of the seventh shifter 1330 with the falling data strobe signal DQSF, and outputs the synchronized signal as a CRC latching control signal LAT_CRC.

The feedback section 1340 is configured to select the output signal of the sixth shifter 1316 and the output signal of the seventh shifter 1330 in response to a CRC selection signal SEL_CRC, having a logic value that depends on the CRC mode, and feed back the selected signal to the first shifter 1311. When the CRC mode is not performed, the output signal of the sixth shifter 1316 is fed back to the first shifter 1311. When the CRC mode is performed, the output signal of the seventh shifter 1330 is fed back to the first shifter 1311.

In this exemplary embodiment of the present invention, the control signal generator 1020 includes the reset section 1350 to smoothly perform the shifting operation. The reset section 1350 may be set in response to the period control signal DISDQS before the shifting operation of the path control shifting section 1310, and reset the signal inputted to the first shifter 1311.

Referring to FIG. 9, the CRC latching unit 970 is configured to latch the third synchronization signal SYN_A3 outputted from the data alignment unit 920 in response to the CRC latching control signal LAT_CRC generated by the latching operation control unit 930, and output the latched signal as a CRC alignment signal ALGN_CRC. The CRC synchronization output unit 980 is configured to synchronize and output the CRC alignment signal ALGN_CRC in response to a CRC input strobe signal DINSTBP_CRC. For reference, CRC data is applied to the third synchronization signal SYN_A3, after the data corresponding to the write command. This is described in more detail with reference to FIGS. 14 to 16.

Figure 14:
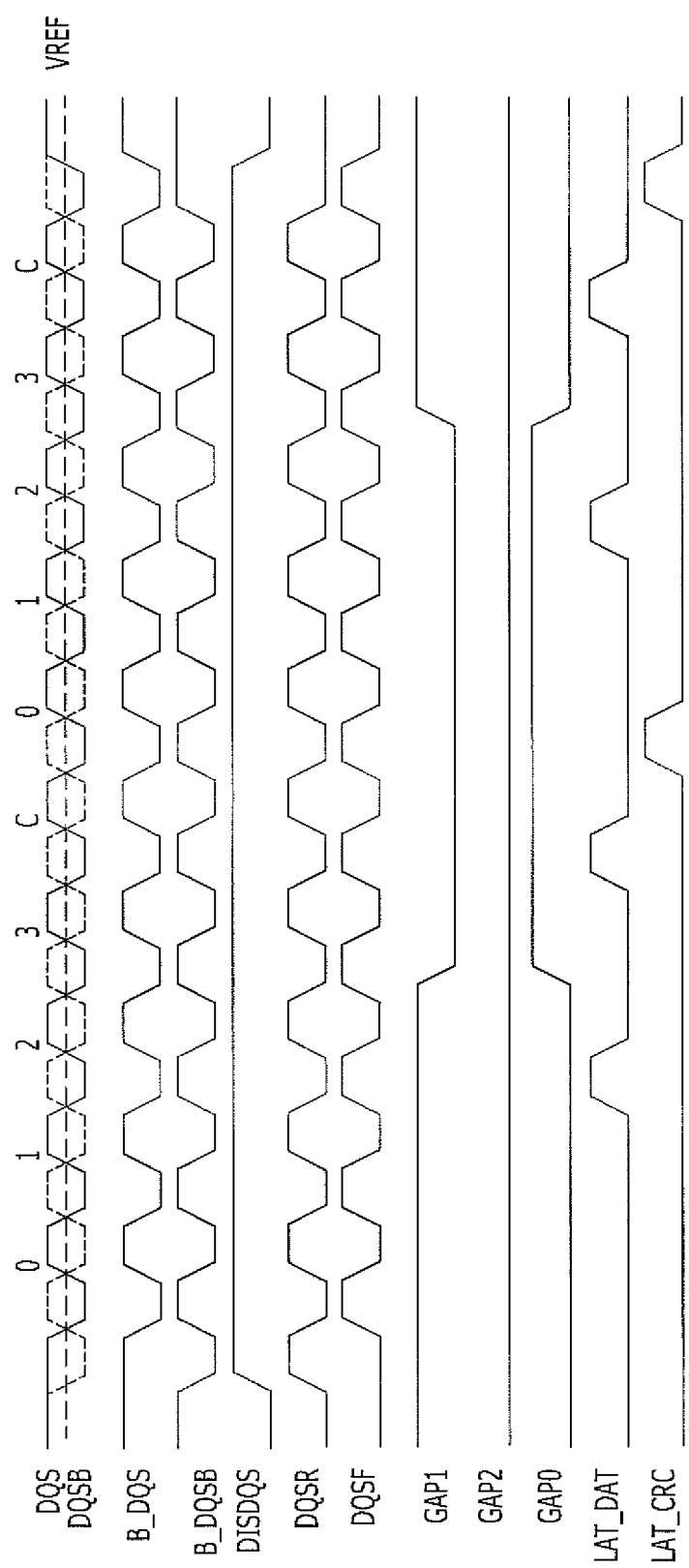
FIGS. 14 to 16 are timing diagrams illustrating an operation of a latching operation control unit of FIG. 9.
Figure 15:
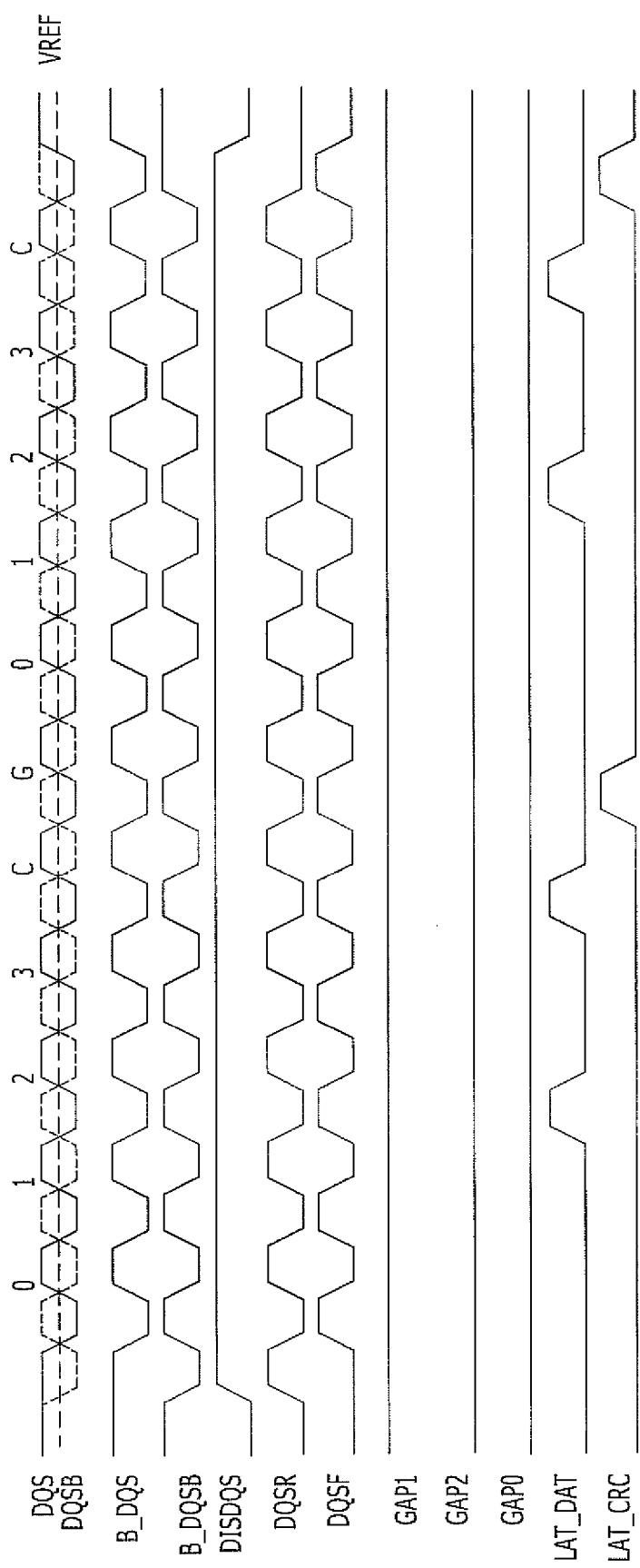
Figure 16:
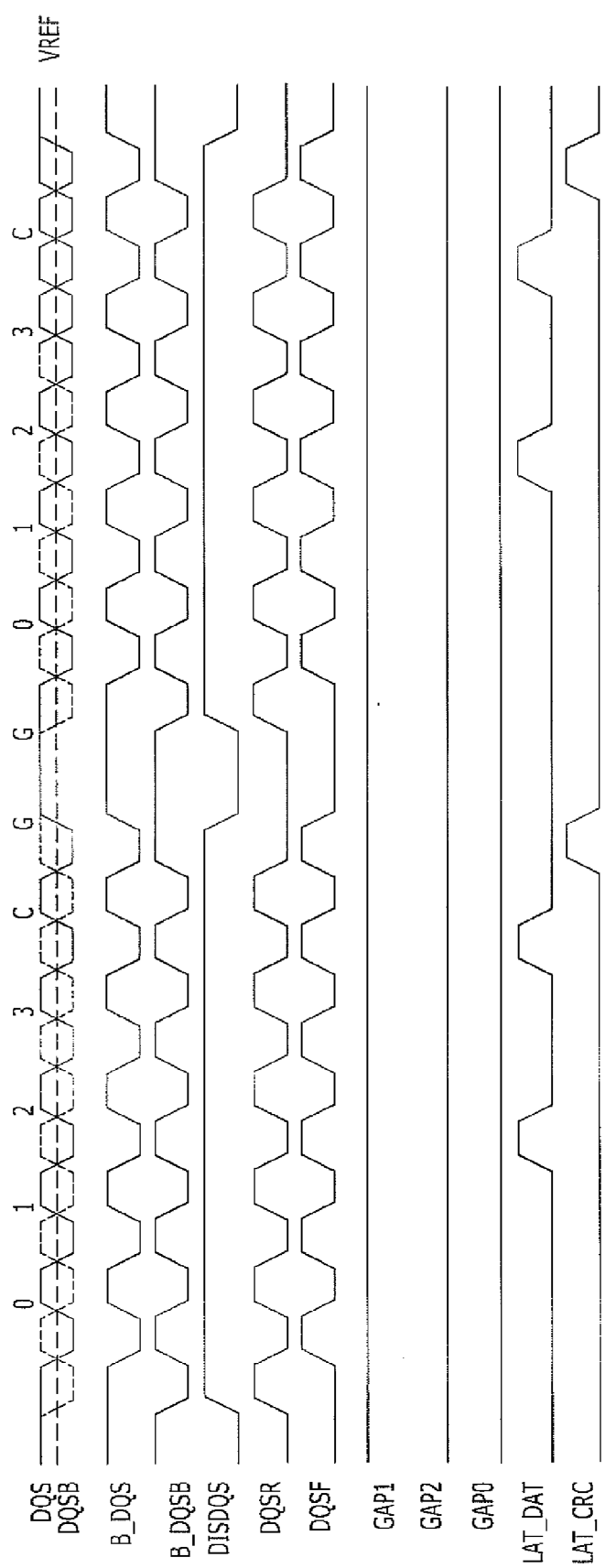

FIGS. 14 to 16 are timing diagrams illustrating an operation of the latching operation control unit 930 of FIG. 9. In FIGS. 14 to 16, a case in which the rising data strobe signal DQSR and the falling data strobe signal DQSF toggle one time during the preamble period and the semiconductor memory device 220 is in the CRC mode is considered. Therefore, the first mode selection signal GAP1 is set to a logic 'high' level before a write operation, and the zeroth and second mode selection signals GAP0 and GAP2 are set to logic 'low' levels.

FIG. 14 shows a case in which the additional write interval is 0. As shown in FIG. 14, data 0, 1, 2, and 3 and CRC data C corresponding to a first write command are inputted, and data 0, 1, 2, and 3 corresponding to a next write command are inputted. Therefore, the zeroth mode selection signal GAP0 changes to a logic 'high' level, and the first mode selection signal GAP1 changes to a logic 'low' level.

Referring to FIGS. 13 and 14, when the zeroth mode selection signal GAP0 is active, it means that the second and third shifters 1312 and 1313 of the path control shifting section 1310 are excluded from the shifting path. Therefore, the data latching control signal LAT_DAT corresponding to the second write command is activated in response to the falling data strobe signal DQSF, after the rising data strobe signal DQSR toggles two times.

FIG. 15 shows a case in which the additional write interval is 1. As shown in FIG. 15, data 0, 1, 2, and 3 and CRC data C corresponding to a first write command are inputted, and data 0, 1, 2, and 3 corresponding to a next write command are inputted after one additional write interval G. Therefore, the zeroth to second mode selection signals GAP0 to GAP2 maintain their original states.

Referring to FIGS. 13 and 15, when the first mode selection signal GAP1 is active, it means that the second shifter 1312 of the path control shifting section 1310 is excluded from the shifting path. Therefore, the data latching control signal LAT_DAT corresponding to the second write command is activated in response to the falling data strobe signal DQSF, after the rising data strobe signal DQSR toggles three times.

FIG. 16 shows a case in which the additional write interval is 2. As shown in FIG. 16, data 0, 1, 2, and 3 and CRC data C corresponding to a first write command are inputted. After two additional write intervals G, data 0, 1, 2, and 3 corresponding to a next write command are inputted. Therefore, the zeroth to second mode selection signals GAP0 to GAP2 maintain their original states.

Referring to FIGS. 13 and 16, when the first mode selection signal GAP1 is active, it means that the second shifter 1312 of the path control shifting section 1310 is excluded from the shifting path. Therefore, as in the case of FIG. 15, the data latching control signal LAT_DAT corresponding to the second write command is activated in response to the falling data strobe signal DQSF, after the rising data strobe signal DQSR toggles three times.

The semiconductor memory device in accordance with an exemplary embodiment of the present invention may control the activation time of the data Latching control signal LAT_DAT depending on the preamble information and the additional write interval. As described with reference to FIG. 13, the activation time of the data latching control signal LAT_DAT may be controlled by adjusting the number of shifters included in the shifting path. The adjusting of the number of shifters means that the initial counting value is controlled in counting the rising data strobe signal DQSR.

As described above, the semiconductor memory device in accordance with an exemplary embodiment of the present invention may secure a sufficient time margin between the aligned data and the data input strobe signal. Therefore, a stable synchronization operation between the aligned data and the data input strobe signal may be guaranteed. Furthermore, the activation time of the latching control signal may be controlled according to an operation mode of the semiconductor memory device. Accordingly, the aligned data may be latched at a desired point of time. Furthermore, even when semiconductor memory device is in the CRC mode, it is possible to guarantee a stable operation.

In accordance with exemplary embodiments of the present invention, a desired synchronization operation is performed by the data input strobe signal with a sufficient time margin, which makes it possible to increase the reliability of the semiconductor memory device.

Furthermore, the latching time of the aligned data is controlled depending on the operation mode. Therefore, it is possible to smoothly perform an operation corresponding to the operation mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device comprising:
a data alignment unit configured to align data, which are sequentially inputted, in response to a data strobe signal;
a latching operation control unit configured to receive the data strobe signal, and generate a latching control signal in response to information indicating an interval between a write operation and a next write operation;
a data latching unit configured to latch an output signal of the data alignment unit in response to the latching control signal; and
a data synchronization output unit configured to synchronize output signals of the data latching unit in response to a plurality of data input strobe signals, and output the synchronized signals to a plurality of data lines,
wherein the data synchronization output unit comprises:
a first synchronization group configured to synchronize the output signals of the data latching unit in response to a first data input strobe signal among the data input strobe signals; and
a second synchronization group configured to synchronize the output signals of the data latching unit with the output signals of the first synchronization group in response to a second data input strobe signal among the data input strobe signals, and output the synchronized signals to the plurality of data lines.

2. The semiconductor memory device of claim 1, wherein the data alignment unit shifts the data in response to the data strobe signal.

3. The semiconductor memory device of claim 1, wherein the data latching unit comprises a plurality of latching sections each configured to latch an input signal in response to the latching control signal.

4. The semiconductor memory device of claim 1, wherein the data input strobe signals corresponds to burst length information.

5. The semiconductor memory device of claim 1, further comprising a rising/falling strobe signal generation unit configured to receive the data strobe signal, generate a rising data strobe signal and a falling data strobe signal, and output the rising data strobe signal and the falling data strobe signal to the data alignment unit.

6. The semiconductor memory device of claim 5, wherein the latching control signal is synchronized with the falling data strobe signal and outputted.

7. The semiconductor memory device of claim 5, wherein the rising/falling strobe signal generation unit comprises:
a buffer unit configured to buffer the data strobe signal;
an activation controller configured to compare the data strobe signal with a reference voltage, and generate a period control signal corresponding to the comparison result; and
an output controller configured to output the output signal of the buffer unit to the data alignment unit in response to the period control signal.

8. The semiconductor memory device of claim 7, wherein the period control signal limits a toggling period of the data strobe signal.

9. A semiconductor memory device comprising:
a data alignment unit configured to align data, which are sequentially inputted, in response to a data strobe signal;
a latching operation control unit configured to receive the data strobe signal during a write operation, generate a latching control signal in response to operation mode information, and generate a cyclic redundancy check (CRC) latching control signal by shifting the latching control signal during a CRC operation mode;

a data latching unit configured to latch an output signal of the data alignment unit in response to the latching control signal;

a data synchronization output unit configured to synchronize output signals of the data latching unit in response to a data input strobe signal, and output the synchronized signals to a plurality of data lines;

an additional latching unit configured to latch the output signal of the data alignment unit in response to the CRC latching control signal; and an additional synchronization output unit configured to synchronize an output signal of the additional latching unit in response to a CRC input strobe signal, and output the synchronized signal.

10. The semiconductor memory device of claim 9, wherein the latching operation control unit comprises:

a mode selector configured to generate a mode selection signal in response to write information, which is active during the write operation, and the operation mode information; and a control signal generator configured to be controlled by the mode selection signal and generate the latching control signal in response to the data strobe signal.

11. The semiconductor memory device of claim 10, wherein the operation mode information comprises information on how many times the data strobe signal toggles in a preamble period.

12. The semiconductor memory device of claim 10, wherein the mode selector comprises:

an information generator configured to receive the write information and generate additional write interval information indicating an interval between a write command and a next write command; and a decoder configured to decode the additional write interval information and the operation mode information and generate the mode selection signal.

13. The semiconductor memory device of claim 12, wherein the information generator comprises:

a plurality of shifting sections configured to shift the write information in response to a clock signal; and an information output section configured to synchronize a corresponding output signal among output signals of the plurality of shifting sections in response to the write information, and output the additional write interval information.

14. The semiconductor memory device of claim 10, wherein the control signal generator comprises:

a path control shifting section configured to set a shifting path corresponding to the mode selection signal and perform a shifting operation through the shifting path in response to the data strobe signal;

a feedback section configured to feed back an output signal of the path control shifting section; and a control signal output section configured to output the output signal of the path control shifting section as the latching control signal in response to the data strobe signal.

15. The semiconductor memory device of claim 14, wherein the path control shifting section comprises:

a data shifting section configured to shift the signal inputted through the feedback section in response to the data strobe signal; and a path setting section configured to set the shifting path of the data shifting section in response to the mode selection signal.

16. The semiconductor memory device of claim 15, further comprising a cyclic redundancy check (CRC) shifting section configured to shift an output signal of the data shifting section in response to the data strobe signal.

17. The semiconductor memory device of claim 16, wherein the control signal output section outputs an output signal of the CRC shifting section, as the CRC latching control signal, in response to the data strobe signal.

18. The semiconductor memory device of claim 16, wherein the feedback section feeds back the output signal of the data shifting section or the output signal of the CRC shifting section depending on the CRC operation mode.

19. The semiconductor memory device of claim 17, further comprising a reset section configured to reset a signal inputted before the shifting operation of the data shifting section.

20. The semiconductor memory device of claim 19, further comprising a rising/falling strobe signal generation unit configured to receive the data strobe signal, generate a rising data strobe signal and a falling data strobe signal, and output the rising data strobe signal and the falling data strobe signal to the data alignment unit.

21. The semiconductor memory device of claim 20, wherein the rising/falling strobe signal generation unit comprises:

a buffer configured to buffer the data strobe signal;

an activation controller configured to compare the data strobe signal with a reference voltage, and generate a period control signal corresponding to the comparison result; and an output controller configured to output an output signal of the buffer to the data alignment unit in response to the period control signal.

22. The semiconductor memory device of claim 21, wherein the data shifting section is reset in response to the period control signal.

23. The semiconductor memory device of claim 21, wherein the additional latching unit is reset in response to the period control signal, and the reset section is set in response to the period control signal.

24. A method for operating a semiconductor memory device, comprising:

aligning data, which are sequentially inputted, in response to a data strobe signal;

receiving the data strobe signal during a write operation, and generating a latching control signal in response to operation mode information;

latching the aligned data in response to the latching control signal;

outputting the latched data to a plurality of data lines in response to a data input strobe signal;

shifting the latching control signal during a cyclic redundancy check (CRC) operation mode, and generating a CRC latching control signal;

latching CRC data aligned in the aligning of the data in response to the CRC latching control signal; and synchronizing the latched CRC data in response to a CRC input strobe signal, and outputting the synchronized CRC data.

25. The method of claim 24, wherein the operation mode information comprises information on how many times the data strobe signal toggles during a preamble period.

26. The method of claim 24, wherein the receiving of the data strobe signal comprises:

receiving the data strobe signal during the write operation; and counting the data strobe signal from an initial counting value corresponding to the operation mode information, and generating the latching control signal when the counting is complete.

27. The method of claim 26, wherein the initial counting value is set according to additional write interval information, which indicates an interval between a write command and a next write command, and the operation mode.

* * * * *